(12) United States Patent
Chen et al.

(10) Patent No.: US 6,426,546 B1
(45) Date of Patent: Jul. 30, 2002

(54) REDUCING RELATIVE STRESS BETWEEN HDP LAYER AND PASSIVATION LAYER

(75) Inventors: Ing-Tang Chen, Taipei; Horng-Bor Lu, Hsin-Chu, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/365,008

(22) Filed: Aug. 2, 1999

(51) Int. Cl.[7] .................. H01L 23/48; H01L 23/52; H01L 29/40

(52) U.S. Cl. ............. 257/640; 257/626; 257/637; 257/758

(58) Field of Search .................. 257/758, 640, 257/637, 626; 438/622, 624, 623, 744, 758, 761, 763, 465

(56) References Cited

U.S. PATENT DOCUMENTS 5,523,616 A * 6/1996 Den ................. 257/637
5,788,767 A * 8/1998 Ko et al. ................. 117/92
6,069,400 A * 5/2000 Kimura et al. ............. 257/633

* cited by examiner

*Primary Examiner*—Olik Chaudhuri
*Assistant Examiner*—Theresa Doan
(74) *Attorney, Agent, or Firm*—Powell Goldstein Frazer & Murphy LLP

(57) ABSTRACT

Structures for reducing relative stress between HDP layer and passivation layer are proposed by the invention, where the HDP layer is formed by high density plasma and the passivation layer is a conventional passivation layer. The invention provides some structures that can be divided into two categories: one, a low stress passivation layer is directly formed on a HDP layer; another, a low stress layer is formed between passivation layer and HDP layer to reduce relative layer that between any two adjacent layers. Therefore, it is crystal-clear that possible structures of the invention comprise following varieties: First, a low stress passivation layer is located between a passivation layer and a HDP layer. Second, a lower stress passivation layer directly locates on a HDP layer. Third, a low stress layer is formed between a passivation layer and a HDP layer.

25 Claims, 4 Drawing Sheets

REDUCING RELATIVE STRESS BETWEEN HDP LAYER AND PASSIVATION LAYER

BACKGROUND OF THE INVENTION

1. Field of the Invention

The present invention relates to integrated circuits, and particularly relates to reducing the relative stress between a passivation layer and a high density plasma layer that is formed with a high density plasma.

2. Description of the Prior Art

In the fabrication of an integrated circuit (IC) that comprises a substrate and at least a set of interconnects, a passivation layer is formed over the entire top surface of the substrate. This is an insulating, protective layer that prevents mechanical and chemical damage during assembly and packaging.

In general, the passivation layer must satisfy the following desired properties:

(1) Provide good scratch protection to underlying structures.
(2) Be impermeable to moisture.
(3) Exhibit low stress.
(4) Provide conformal step coverage.
(5) Demonstrate high thickness uniformity.
(6) Be impermeable to sodium atoms and other high mobile impurities.
(7) Be easily patterned.
(8) Demonstrate good adhesion to conductor.

A serious defect of the passivation layer is a result of the passivation layer being broadly formed by chemical vapor deposition (CVD) process in contemporary techniques. Therefore, the coverage ability of the CVD induces a disadvantage that adjacent conductive lines on the top surface of the integrated circuit may not be properly isolated by the passivation layer, which is more serious when integration of the integrated circuit is increased.

FIG. 1 shows a rough illustration of a cross-section view of an integrated circuit with some disadvantages. Isolation 11, gate 12, spacer 13, source 14 and drain 15 are located in and on substrate 10. Besides, interconnects 16, contacts 17 and dielectric layers 18 are formed on substrate to provide required metallization structure. Additionally, conductive lines 19 are formed on the metallization structure and affected as interconnects. Therefore, when passivation layer 193 is formed on the metallization structure by CVD, owing to the coverage of CVD, it is possible that void 196 is formed between two adjacent conductive lines 19 and increases the risk that adjacent conductive lines 19 are not properly isolated.

A well-known method which is broadly applied in the fabrication of the integrated circuit having a critical dimension less than 0.5 $\mu$m to overcome the previous disadvantage to to form passivation layer 196 that directly covers conductive lines 19 by CVD with a high density plasma, as shown in FIG. 2. Characteristic of the method is that during deposition, a DC bias is applied on the wafer and then particles of plasma such as Ar will collide the deposited high density plasma layer 195. Therefore, owing to the fact that colliding frequency is proportional to the electric field and the field is larger in edges of high density plasma layer 195, hinges of high density plasma layer 195 are eliminated by collision and then no void is formed. Incidentally, owing to the fact the colliding frequency is larger in the edge and is smaller in the top, the thickness of high density plasma layer 195 is not uniform even if it covers a smooth surface.

Nevertheless, high density plasma layer 195 cannot properly protect against permeation of wafer and gas. An improved method is provided wherein passivation layer 193 is formed on high density plasma layer 195 to improve the quality of passivation of the integrated circuit. In other words, an integrated circuit is protected by a complex passivation layer that is formed by HDP and deposition in sequence.

However, an inevitable disadvantage of the improved method is that the absolute value of relative stress between high density plasma layer 195 and passivation layer 193 is about $1.8E08$ dynes/cm$^2$, such a high relative stress increases the risk that passivation of integrated circuit is degraded by cracks and pealing of passivation. FIG. 3 shows the possible result of high relative stress. Where there are a plurality of cracks and pealing in passivation layer 193, and other parts of the integrated circuit are omitted.

Therefore, it is indisputable that development of a new structure of passivation to overcome the disadvantage of high relative stress is desired, and the new structure of passivation is more important as high density plasma layer 195 is irreplaceable.

SUMMARY OF THE INVENTION

It is an object of the invention to propose some structures that efficiently prevent cracking and pealing which are induced by high relative stress.

It is another object of the invention to provide some structures that prevent formation of void by employing a high density passivation layer (HDP layer) which is formed by high density plasma.

It is a further object of the invention to provide some structures that are manufacturable.

In order to realize the objects of the invention, some structures are provided. These structures can be divided into two main categories:

First category, a low stress passivation layer is directly formed on a HDP layer.

Second category, a low stress layer is formed between passivation layer and HDP layer to reduce relative layer that between any two adjacent layers.

Therefore, possible structures of the invention comprise following varieties:

First, a low stress passivation layer is located between a passivation layer and a HDP layer.

Second, a lower stress passivation layer directly locates on a HDP layer.

Third, a low stress layer is formed between a passivation layer and a HDP layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The spirit of the proposed invention can be explained and understood by the following three embodiments with corresponding figures.

The first embodiment is a structure for reducing relative stress between a passivation layer and a HDP layer. A typical absolute value of relative stress between a HDP layer that material is $SiO_2$ and passivation layer that material is SiN is about 8.0E09 dynes/$cm^2$.

Figure 4:
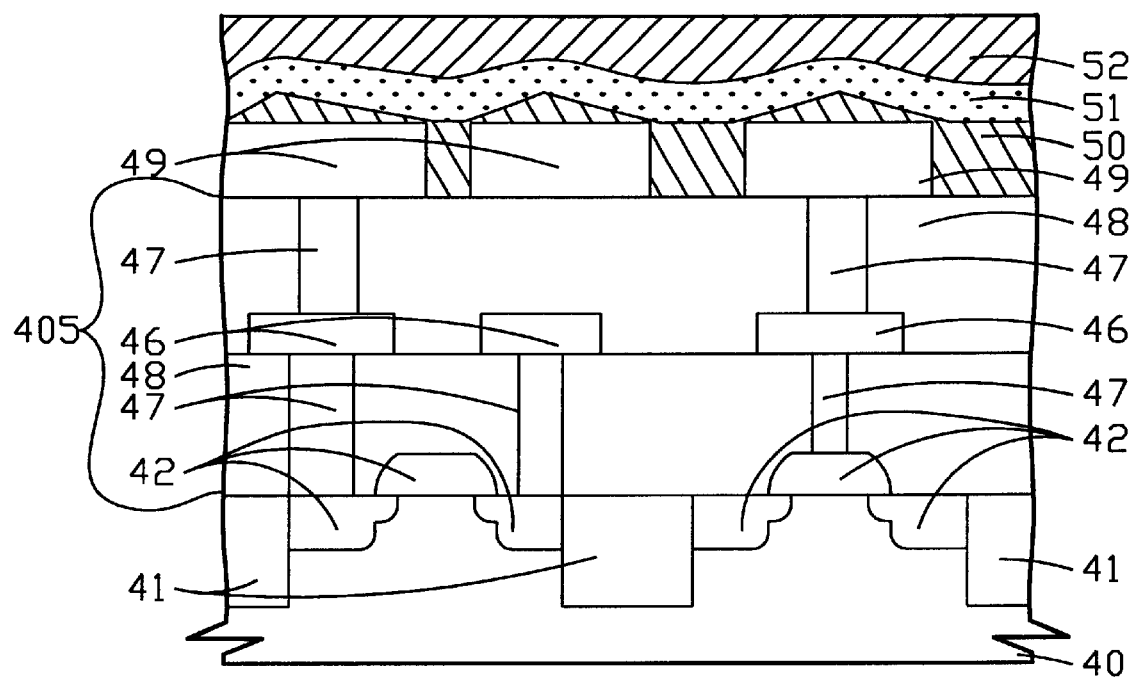
FIG. 4 is a brief illustration of a cross-sectional view of an integrated circuit with a structure that is the first proposed structure of the invention.

Referring to FIG. 4, the structure of first embodiment comprises substrate 40, multi-level structure 405, a plurality of metal lines 49, HDP layer 50, low stress passivation layer 51 and passivation layer 52. In additional, though FIG. 4 only illustrates two-level case of multi-level structure 405, the embodiment is not restricted by it.

These parts must satisfy the following requirements:

(1) Material of substrate 40 comprises silicon and substrate 40 comprises a plurality of elements such as isolations 41 and metal oxide semiconductor transistors 42.

(2) Multi-level structure 405 locates on substrate 40, wherein number of layer of multi-level structure 405 varies from about 2 to about 7. Beside, multi-level structure 405 comprises a plurality of interconnects 46, a plurality of contacts 47 and a plurality of dielectric layers 48.

(3) A plurality of metal lines 49 that locate on a top surface of multi-level structure 405, where material of metal lines 49 comprises aluminum.

(4) HDP layer 50 that covers top surface of multi-level structure 405 and isolates each of metal lines 49 from other metal lines 49. Wherein HDP 50 layer is formed by deposition with a high density plasma and material of HDP layer 50 comprises low dielectric constant dielectric.

(5) Low stress passivation layer 51 that covers HDP layer 50, wherein stress of low stress passivation layer 51 is stronger than stress of HDP layer 50, and material of low stress passivation layer 51 comprises silicon nitride. Moreover, methods for reducing stress of low stress passivation layer 51 comprise adjusting a low frequency power source of a reactor which is used to form low stress passivation layer 51.

(6) Passivation layer 52 that covers low stress passivation layer 51, where stress of passivation layer 52 is stronger than stress of low stress passivation layer 51. Herein, material of passivation layer 52 comprises silicon nitride and methods of forming passivation layer 52 comprise chemical vapor deposition. Beside, the embodiment further comprises a chemical mechanical polishing process to level a top surface of passivation layer 52.

Therefore, because both relative stress between HDP layer 50 and low stress passivation layer 51 and relative stress between low stress passivation layer 51 and passivation layer 52 are smaller than relative stress between HDP layer 50 and passivation layer 52, disadvantages of high relative stress such as cracking and pealing are efficiently protected by the first embodiment.

Figure 1:
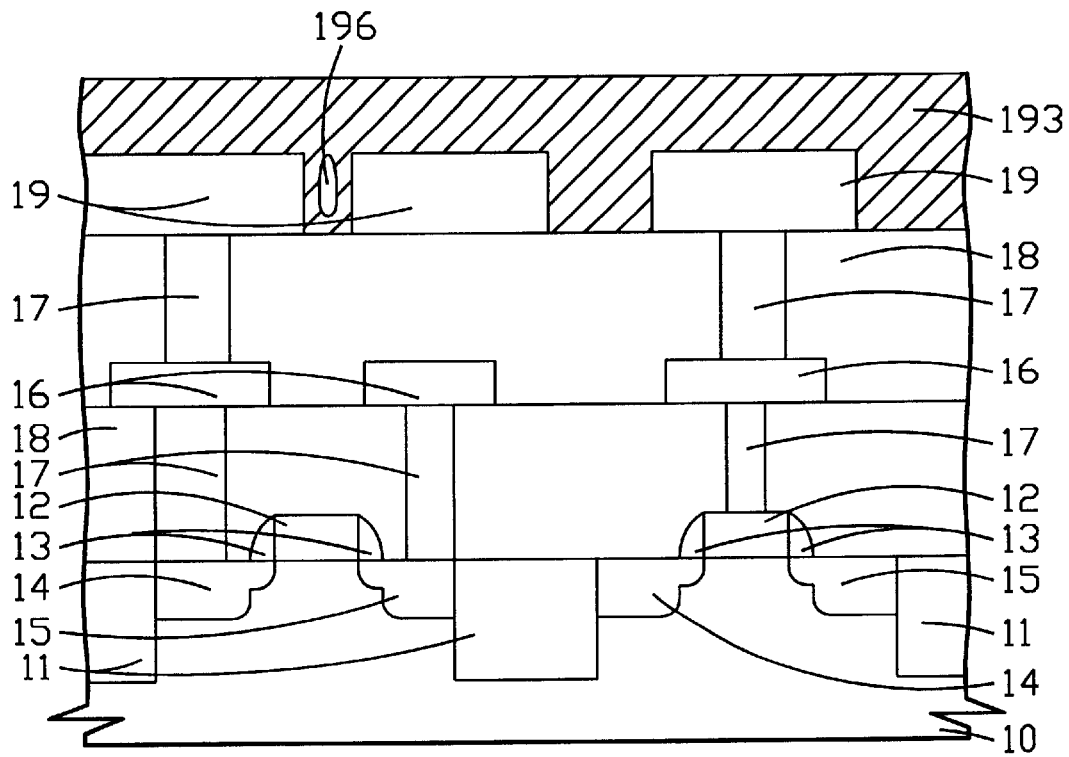
FIG. 1 is a rough illustration of a cross-sectional view of an integrated circuit that forms passivation layer by deposition.
Figure 2:
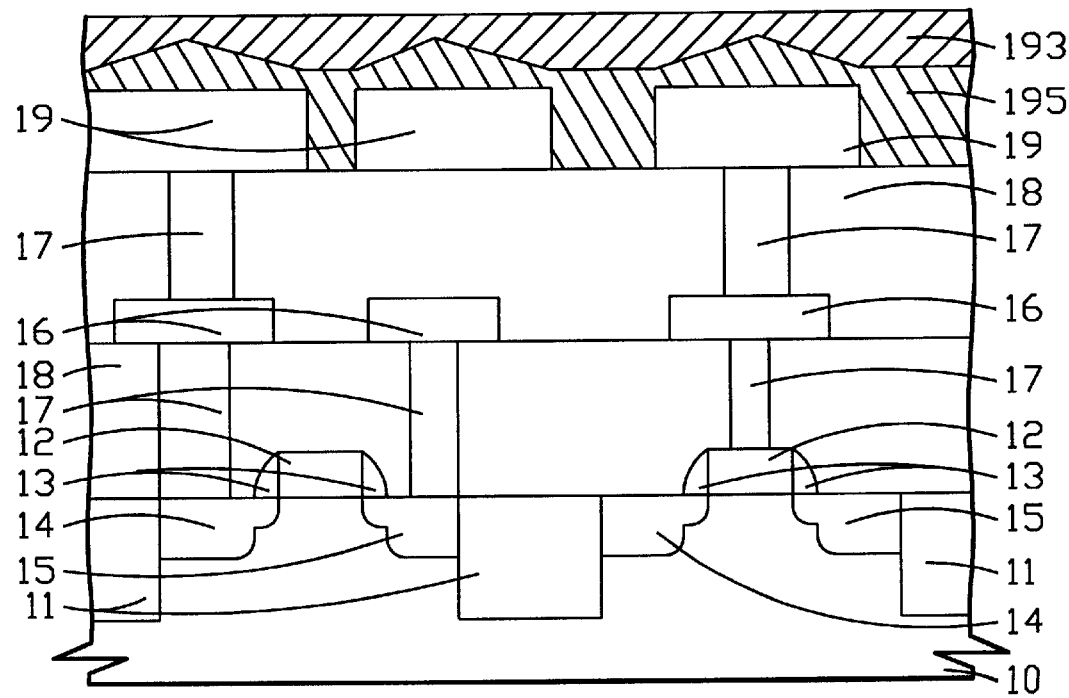
FIG. 2 is another rough illustration of a cross-sectional view of an integrated circuit that forms passivation layers by HDP and deposition in sequence.
Figure 3:
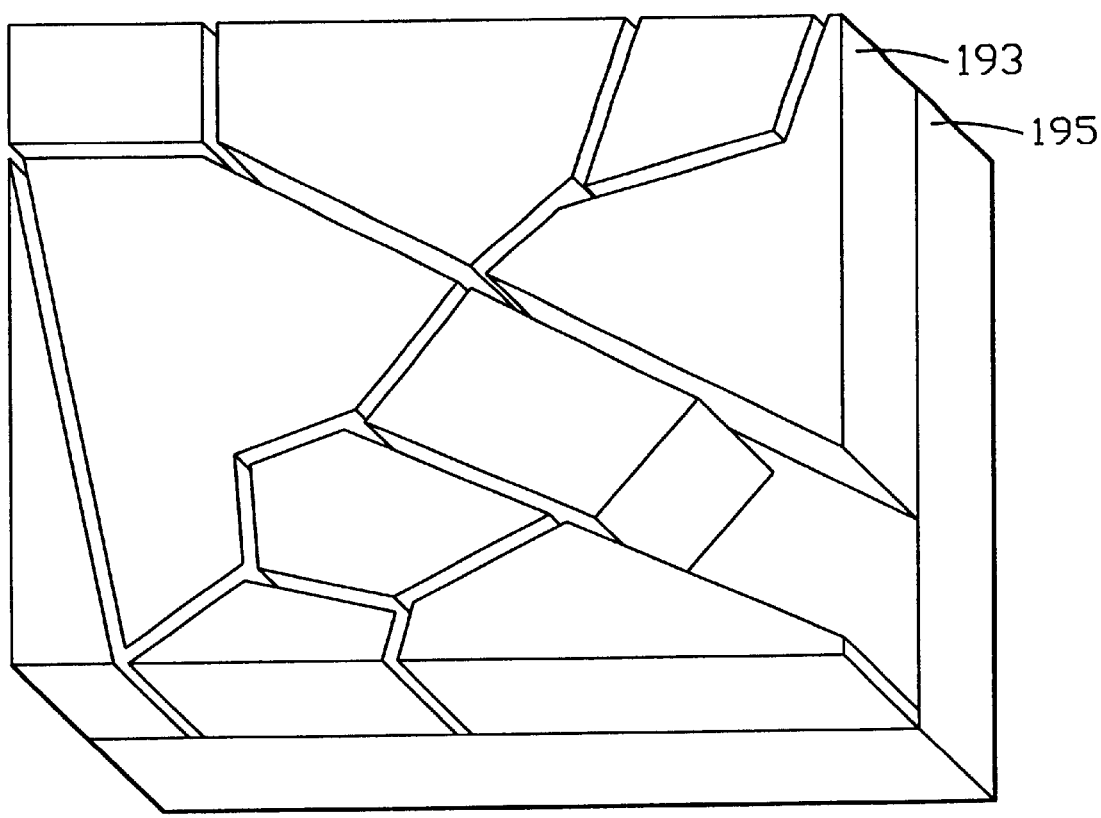
FIG. 3 is a qualitative illustration about disadvantages between passivation formed by deposition and the passivation layer formed by high density plasma, where other parts of the integrated circuit are omitted.

Besides, because low stress passivation layer 51 also has the ability to prevent chemical and mechanical damage, as other conditions are equivalent, the required thickness of passivation layer 52 in the embodiment is smaller than the required thickness of passivation layer 193 of well-known fabrication which is shown in FIG. 2. On the other hand, owing to the fact that forming rate of low stress passivation layer 51 is slower than forming rate of passivation layer 52, especially when low stress passivation layer 51 is formed by adjusting a low frequency power, the throughput of the embodiment is degraded by formation of low stress passivation layer 51.

Figure 5:
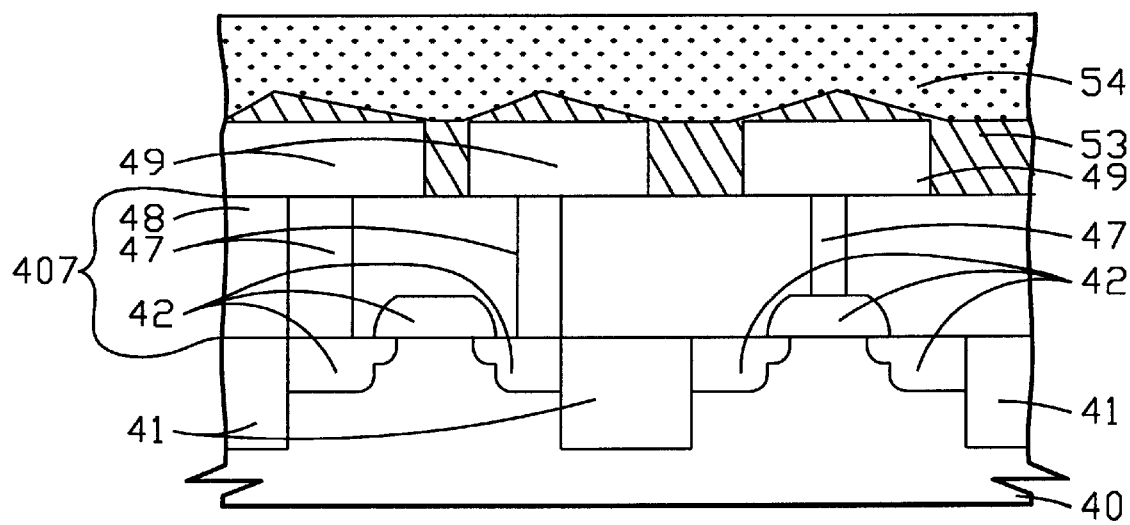
FIG. 5 is a brief illustration of a cross-sectional view of an integrated circuit with a structure that is the second proposed structure of the invention.

The second embodiment, briefly illustrated in FIG. 5, relates to a structure for reducing relative stress between passivation layer 54 and HDP layer 53, wherein HDP layer 53 is formed by a high density plasma.

The second embodiment comprises the following parts: substrate 40 that comprises a plurality of elements; single-level structure 407 located on substrate 40. Single-level structure 407 comprises a plurality of interconnects 46, a plurality of contacts 47 and dielectric layer 48; a plurality of metal lines 49 located on a top surface of single-level structure 407; HDP layer 53 that covers the top surface of single-level structure 407; HDP layer 53 that covers the top surface of single-level structure 407 and isolates each metal line 49 from other metal lines 49; low stress passivation layer 54 that cover HDP layer 53, wherein stress of low stress passivation layer 54 is a bit stronger than stress of HDP layer 53. Consequentially, these parts of the proposed embodiment also must satisfy the following additional conditions:

First, elements of substrate 40 comprise isolations 41 and metal oxide semiconductor transistors 42.

Second, material of metal lines 49 comprises aluminum.

Third, material of HDP layer 53 comprises silicon oxide.

Fourth, material of low stress passivation layer 54 comprises silicon nitride.

Fifth, stress of low stress passivation layer 54 is reduced by adjusting a low frequency power source of a reactor that is used to form low stress passivation layer 54.

Sixth, the provided embodiment further comprises leveling a top surface of low stress passivation layer 54.

Obviously, owing to the fact that relative stress between HDP layer 53 and low stress passivation layer 54 is smaller than relative stress between HDP layer 195 and passivation layer 193, disadvantages of high relative stress such as crack and pealing also are protected by the second embodiment.

Additionally, as in the previous embodiment, because the forming rate of low stress passivation layer 54 is slower, especially when low stress passivation layer 53 is formed by adjusting a low frequency power, the throughput of the embodiment is degraded by formation of low stress passivation layer 54. Particularly, since in the second embodiment only low stress passivation layer 54 is formed on HDP layer 53, throughput of the second embodiment is slower than the first embodiment. Regardless, the second embodiment has an advantage that fabrication is simple because the formation process of low stress passivation layer 54 does not need to be adjusted.

Figure 6:
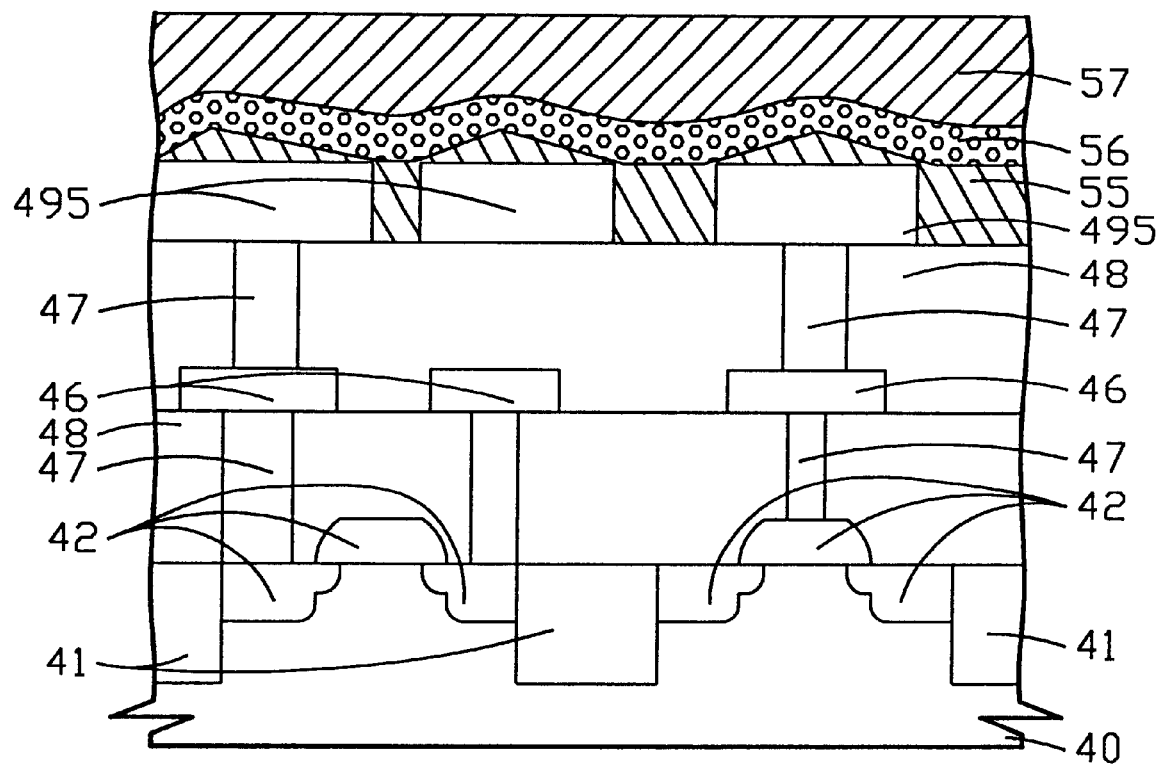
FIG. 6 is a brief illustration a cross-sectional view of an integrated circuit with a structure that is the third proposed structure of the invention.

Consequently, referring to FIG. 6, the third embodiment is a structure for reducing relative stress between passivation layer 57 and silicon dioxide layer 55, where a chemical vapor deposition process with a high density plasma is used to form the silicon dioxide layer 55.

As shown in FIG. 6, the third embodiment comprises substrate 40, a plurality of semiconductor structures located on substrate 40, a plurality of conductive line 495 located on a top surface of these semiconductor structures, silicon dioxide layer 55 that covers a top surface of these semiconductor structures and isolates each conductive line 495 from other conductive lines 495, a low stress layer 56 that covers silicon dioxide layer 55, and passivation layer 57 that covers low stress layer 56.

Indisputably, to efficiently reduce the relative stress, not only is the stress of low stress layer 56 larger than the stress of silicon dioxide layer 55, but also the stress of passivation layer 57 is stronger than the stress of low stress layer 56.

Besides, in the embodiment, a plurality of elements located in and on the substrate where elements comprise isolations 41 and metal oxide semiconductor transistors 42. And these semiconductor structures comprise a plurality of interconnects 46, a plurality of contacts 47 and at least one dielectric layer 48.

Moreover, material for conductive lines 495 is chosen from a group consisting of metal, polysilicon and silicide. And material for low stress layer 56 comprises tetraethylorthosilicate.

Herein, low stress layer 56 comprises a thin film with adjustable stress, and a typical thickness of low stress layer 56 is from about 100 angstroms to 3000 angstroms. In addition, material of passivation layer 57 comprises silicon nitride.

As a matter of fact, in the third embodiment, low stress layer 56 need not have the ability to protect chemical and mechanical damage. Therefore, any material with stress between stress of silicon dioxide layer 55 and stress of passivation layer 57 can be used to form low stress layer 56, and then high relative stress between silicon dioxide layer 55 and passivation layer 57 can be more efficiently reduced by the third embodiment. Of course, an unavoidable disadvantage of the third embodiment is that fabrication is complicated by the formation of low stress layer 56.

While the invention has been described by three embodiments, the invention is not limited there to. To the contrary, it is intended to cover various modifications, procedures and products, and the scope of the appended claims therefore should be accorded to the broadest interpretation so as to encompass all such modifications and similar arrangement, procedures and products.

What is claimed is:

1. A structure for reducing relative stress between a passivation layer and a HDP layer, said structure comprising:

a substrate, said substrate comprise a plurality of elements;

a multi-level structure that locates on said substrate, said multi-level structure comprises a plurality of interconnects, a plurality of contacts and a plurality of dielectric layers;

a plurality of metal lines, said metal lines locate on a top surface of said multi-level structure;

a HDP layer, said HDP layer covers said top surface of said multi-level structure and isolates each of said metal lines from other said metal lines, said HDP layer is formed by a high density plasma;

a low stress passivation layer, said low stress passivation layer covers said HDP layer, wherein stress of said low stress passivation layer is stronger than stress of said HDP layer; and a passivation layer, said passivation layer covers said low stress passivation layer, where stress of said passivation layer is stronger than stress of said low stress passivation layer.

2. The structure according to claim 1, wherein material of said substrate comprises silicon.

3. The structure according to claim 1, wherein said elements comprise a plurality of isolations and a plurality of metal oxide semiconductor transistors.

4. The structure according to claim 1, wherein number of layer of said multi-level structure varies from about 2 to about 7.

5. The structure according to claim 1, wherein material of said metal lines comprises aluminum.

6. The structure according to claim 1, wherein material of said HDP layer comprises low dielectric constant dielectric.

7. The structure according to claim 1, wherein material of said low stress passivation layer comprises silicon nitride.

8. The structure according to claim 1, wherein methods for reducing stress of said low stress passivation layer comprises adjusting a low frequency power source of a reactor which is used to form said low stress passivation layer.

9. The structure according to claim 1, wherein material of said passivation layer comprises silicon nitride.

10. The structure according to claim 1, wherein methods of forming said passivation layer comprises chemical vapor deposition.

11. The structure according to claim 1 further comprises leveling a top surface of said passivation layer by a chemical mechanical polishing process.

12. A structure for reducing relative stress between a low passivation layer and a HDP layer, wherein said HDP layer is formed by a high density plasma, said structure comprising:

a substrate, said substrate comprise a plurality of elements;

a single-level structure that locates on said substrate; said single-level structure comprises a plurality of interconnects, a plurality of contacts and a dielectric layer;

a plurality of metal lines, said metal lines locate on a top surface of said single-level structure;

a HDP layer, said HDP layer covers said top surface of said single-level structure and isolates each of said metal lines from other said metal lines; and a low stress passivation layer, said low stress passivation layer covers said HDP layer, wherein stress of said low stress passivation layer is bit different to stress of said HDP layer.

13. The structure according to claim 12, wherein elements comprise a plurality of isolations and a plurality of metal oxide semiconductor transistors.

14. The structure according to claim 12, wherein material of said metal lines comprises aluminum.

15. The structure according to claim 12, wherein material of said HDP layer comprises silicon oxide.

16. The structure according to claim 12, wherein material of said low stress passivation layer comprises silicon nitride.

17. The structure according to claim 12, where stress of said low stress passivation layer is reduced by adjusting a low frequency power source of a reactor that is used to form said low stress passivation layer.

18. The structure according to claim 12 further comprises leveling a top surface of said low stress passivation layer.

19. A structure for reducing relative stress between a passivation layer and a silicon dioxide layer, wherein said silicon dioxide layer is formed by a chemical vapor deposition process with a high density plasma, said structure comprising:
   a substrate;
   a plurality of semiconductor structures that locate on said substrate, wherein said semiconductor structures comprise a plurality of interconnects, a plurality of contacts and at least a dielectric layer;
   a plurality of conductive lines, said conductive lines locate on a top surface of said semiconductor structures;
   a silicon dioxide layer, said silicon dioxide layer covers said top surface of said semiconductor structures and isolates each of said conductive lines from other said conductive lines;
   a low stress layer, said low stress layer covers said silicon dioxide layer, and stress of said low stress layer is larger than stress of said silicon dioxide layer; and
   a passivation layer, said passivation layer covers said low stress layer, wherein stress of said passivation layer is stronger than stress of said low stress layer.

20. The structure according to claim 19, wherein a plurality of elements locate in and on said substrate, said elements comprise a plurality of isolations and a plurality of metal oxide semiconductor transistors.

21. The structure according to claim 19, wherein material of said conductive lines is chosen from a group consisting of metal, polysilicon and silicide.

22. The structure according to claim 19, wherein material of said low stress layer comprises tetraethyl-orthosilicate.

23. The structure according to claim 19, wherein said low stress layer comprises a thin film with adjustable stress.

24. The structure according to claim 19, wherein a typical thickness of said low stress layer is from about 1000 angstroms to 3000 angstroms.

25. The structure according to claim 19, wherein material of said passivation layer comprises silicon nitride.

* * * * *